United States Patent [19]
Okatani et al.

[11] 4,205,353
[45] May 27, 1980

[54] COMBINATION DEVICE HAVING A MAGNETIC RECORDING AND REPRODUCING UNIT AND AN ELECTRONIC TUNING TYPE RECEIVER

[75] Inventors: Masanao Okatani; Hiroshi Onishi; Yoshiaki Ishibashi; Reisuke Sato; Hisashi Suganuma; Tomohisa Yokogawa; Yoshiharu Ueki; Haruo Kama; Tadashi Kosuga; Tadashi Ogawa, all of Kawagoe, Japan

[73] Assignee: Pioneer Electronics Corporation, Tokyo, Japan

[21] Appl. No.: 926,347

[22] Filed: Jul. 20, 1978

[30] Foreign Application Priority Data

Jul. 20, 1977 [JP] Japan .................................. 52-87070

[51] Int. Cl.² ............................................................ G11B 15/12
[52] U.S. Cl. ................................. 360/61; 179/100.11; 455/186; 455/344
[58] Field of Search ................... 325/311; 179/100.11; 360/61, 62, 137

[56] References Cited

U.S. PATENT DOCUMENTS

| | | | |
|---|---|---|---|
| 3,611,151 | 10/1971 | Fernandez | 179/100.11 |
| 3,943,567 | 3/1976 | Kazuo | 179/100.11 |
| 3,995,123 | 11/1976 | Wilson | 364/705 |
| 4,063,046 | 12/1977 | Schiffman et al. | 364/705 |
| 4,085,371 | 4/1978 | Mogi et al. | 325/464 |

*Primary Examiner*—Vincent P. Canney
*Attorney, Agent, or Firm*—Sughrue, Rothwell, Mion, Zinn and Macpeak

[57] ABSTRACT

A combination device having a magnetic recording and reproducing unit and an electronic tuning type receiver, where the channel presetting switches of the electronic tuning type receiver also can act as the operating switches of the magnetic recording and reproducing unit. The electronic tuning type receiver is of the type which is tuned by control signals provided to a tuning means by a plurality of channel selecting switches. A selection circuit is interposed between the tuning means and the plurality of channel selecting switches and provides the plurality of control signals to the tuning means when a selection switch is in a first binary state, and provides the plurality of control signals to a tape-control section when the selection switch is in a second binary state. The tape-control section, in response to the plurality of control signals, controls the mode of operation of the magnetic recording and reproducing unit, and also provides a signal indicating the mode of operation to a sensing circuit. The sensing circuit, in turn, provides mode signals to a digital display unit which can visually display the mode of operation when the magnetic recording and reproducing unit is being used, as well as can visually display the station frequency or the like of the selected station when the electronic tuning type receiver is being used.

7 Claims, 1 Drawing Figure

COMBINATION DEVICE HAVING A MAGNETIC RECORDING AND REPRODUCING UNIT AND AN ELECTRONIC TUNING TYPE RECEIVER

BACKGROUND OF THE INVENTION

1. Field of the Invention

This invention relates to a combination device having a magnetic recording and reproducing unit and an electronic tuning type receiver where the channel presetting switches of the electronic tuning type receiver also can act as the operating switches of the magnetic recording and reproducing unit.

2. Description of the Prior Art

Recently, as a result of the rapid progress in electronic technology, a receiver capable of electronically performing preset station selection has been proposed. In this preset type receiver, a memory is addressed by the outputs from band selecting and channel selecting switches, and band and channel signals stored in the selected address of the memory are read out and provided to an up-down counter. The up-down counter also provides to the user the capability of manually tuning of the receiver.

In the present mode of operation, the digital output of the up-down counter is converted into an analog signal and is applied to an electronically-controlled variable capacitance diode (varactor diode). The variable capacitance diode is part of the tuning circuit of the receiver. Thus, the digital information read out from the selected address of the memory controls via the up-down counter the signal selected by the tuning circuit of the preset type receiver.

The channel selecting switches mentioned above are, for example, non-lock type push-button switches, while the band selecting switch is, for example, a rotary switch. Whenever these channel selecting switches and the band selecting switch provide channel and band selecting address signals to the memory, the band and channel signals stored in the selected address are outputted and provided to the up-down counter.

In the electronic tuning type receiver thus discussed, the tuning information for a desired station is stored for future retrieval when both the channel selecting switches and a presetting switch are selectively operated, e.g., closed, by the user.

When such an electronic tuning type receiver is combined with a magnetic recording and reproducing unit, the number of required switches for both units is greatly increased. Specifically, the band selecting and the channel selecting switches for the electronic tuning type receiver must be provided as well as the switches for operating the magnetic recording and reproducing unit. The number of required switches inherently increases the size of the combined unit because of the panel area needed to accommodate the switches. In addition, the required switches substantially increase both manufacturing and maintenance costs, and also may have an undesired aesthetic effect due to panel crowding and to a cluttered appearance.

SUMMARY OF THE INVENTION

Accordingly, it is an object of the present invention to provide a combination device of an electronic tuning type receiver and a magnetic recording and reproducing unit where the channel presetting switches of the electronic tuning type receiver can also act as the operating switches of the magnetic recording and reproducing unit.

In the first embodiment, the combination device of the present invention has a magnetic recording and reproducing unit and an electronic tuning type receiver, and the channel presetting switches of the electronic tuning type receiver also can act as the operating switches of the magnetic recording and reproducing unit. The electronic tuning type receiver is of the type which is tuned by control signals provided to a tuning means by a plurality of channel selecting switches. A selection circuit is interposed between the tuning means and the plurality of channel selecting switches and provides the plurality of control signals to the tuning means when a selection switch is in a first binary state, and provides the plurality of control signals to a tape-control section when the selection switch is in a second binary state. The tape-control section, in response to the plurality of control signals, controls the mode of operation of the magnetic recording and reproducing unit, and also provides a signal indicating the mode of operation to a sensing circuit. The sensing circuit, in turn, provides mode signals to a digital display unit which can visually display the mode of operation when the magnetic recording and reproducing unit is being used, as well as can visually display the station frequency or the like of the selected station when the electronic tuning type receiver is being used.

In the second embodiment, the combination device has a magnetic recording and reproducing unit and an electronic tuning type receiver, and the channel presetting switches of the electronic tuning type receiver also can act as the operating switches of the magnetic recording and reproducing unit. A selection circuit provides the outputs from the channel presetting switches to the control section and read-write memory when a selection switch is in a first binary state, and provides the outputs to a tape-control section when the switch is in a second binary state. The tape-control section, in response to the outputs, controls the mode of operation of the magnetic recording and reproducing unit, and also provides a signal indicating the mode of operation to a sensing circuit. The sensing circuit converts the indicating signal into pulse signals, which are provided in modified form to a digital display unit by an up-down counter. The digital display unit thus can visually display the mode of operation when the magnetic recording and reproducing unit is being used, as well as can visually display the station frequency or the like of the selected station when the electronic tuning type receiver is being used.

DETAILED DESCRIPTION OF THE PREFERRED EMBODIMENT

Figure 1:
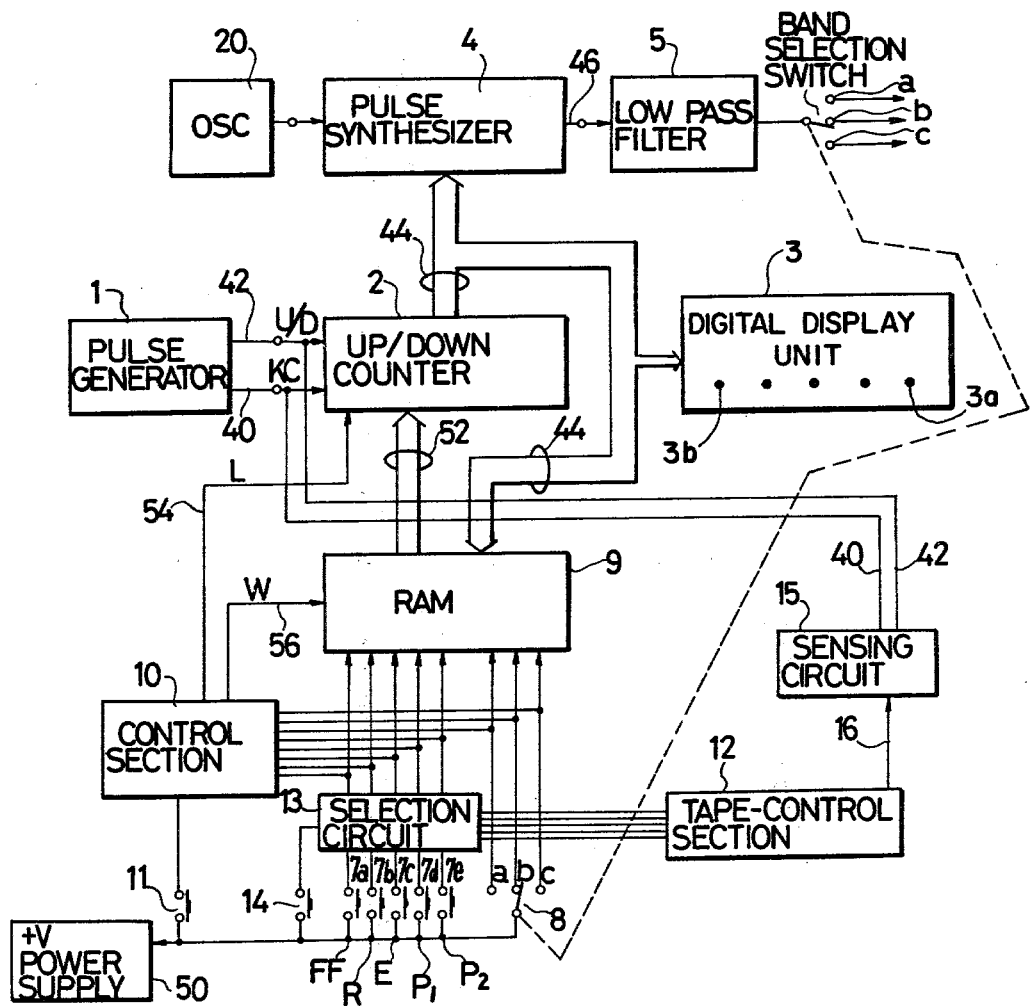
FIG. 1 shows in block diagram form one embodiment of the combination device of an electronic tuning type receiver and a magnetic recording and reproducing unit of the present invention, where the channel presetting switches of the electronic tuning type receiver can also act as the operating switches of the magnetic recording and reproducing unit.

Turning now to FIG. 1, the electronic tuning type receiver of the combination device of the present invention includes the following. A pulse generator 1 selectively generates an up-pulse, designated by the reference letter U, or a down-pulse, designated by a reference letter D, together with a clock pulse, designated by the reference letters KC, when the user manually tunes the receiver to select a desired frequency or signal. The up-pulse/down-pulse information and the clock pulse information is provided via lines 40, 42, respectively, to a binary up/down counter 2. Counter 2 counts the clock pulse information from line 40 in either an up or a down direction in accordance with the information present on the up/down pulse line 42. The output count information from counter 2 is in a parallel format and is provided to a bus 44.

A digital display unit 3 is adapted to receive from bus 44 the several higher significant bits of the count output from counter 2. Digital display unit 3 provides a digital visual display of the frequency being selected by the tuning circuit (not shown), and also provides a digital visual display of the tape direction and speed of the magnetic recording and reproducing unit, as is discussed below in detail.

A pulse synthesizer 4 is adapted to receive from bus 44 the count output from counter 2. An oscillation signal generated by an oscillator 20 is provided to pulse synthesizer 4 and is frequency-divided thereby in accordance with the count output from counter 2 so that a serial pulse train having a pulse number which corresponds to the output of the counter 2 is provided at an output line 46 of pulse synthesizer 4. The serial pulse train on line 46 is provided to the input of a low-pass filter 5, which removes the high frequency components and provides on an output line 48 a DC voltage signal whose amplitude corresponds to the count output from counter 2. In other words, low-pass filter 5 acts as a digital-to-analog converter of the serial pulse train on line 46. The DC voltage signal on line 48 is selectively applied via a band selecting switch 6, discussed in detail below, to the electronically-controlled variable capacitance diode (varactor diode) in the tuning circuit (not shown). Thus, the DC voltage signal on line 48 electronically controls the tuning of the receiver.

The band selecting switch 6 allows the user to manually select the desired band of frequencies for which the receiver is tuned. As shown in FIG. 1, switch 6 has three stationary contacts a, b, c for selecting bands A, B or C, respectively. Of course, switch 6 can have any desired number of stationary contacts. Switch 6 is associated in ganged fashion with a band selecting switch 8 which also has three stationary contacts a, b, c for selecting bands A, B, or C, respectively. As is the case of switch 6, switch 8 can also have any desired number of stationary contacts.

Separate channel selecting switches 7a to 7c of the non-lock or push button type are also provided. As is discussed in detail below, channel selecting switches 7a through 7e also correspond to the "fast forward (FF)" "rewind (R)", "eject (E)", "play (P1)" and "play (P2)" switches, respectively, of the magnetic recording and reproducing unit. Hereinafter unless otherwise noted switches 7a through 7e are referred to as channel selecting switching unless they are used to control the magnetic recording and reproducing unit. In the second case, switches 7a to 7e are referred to a mode control switches 7a to 7e.

Channel selecting switches 7a to 7e selectively provide control voltages from power supply 50 to a selection circuit 13. A selection switch 14 also selectively provides the control voltage from power supply 50 to the selection circuit 13. A plurality of output lines corresponding to the channel selecting switches 7a to 7e are connected to a read-write memory 9. Similarly, a plurality of output lines corresponding to the mode control switches 7a to 7e are connected to a tape-control section 12. When selection switch 14 is in the OFF state, the outputs of switches 7a to 7e are provided by the selection circuit 13 to the plurality of lines connected to read-write memory 9, whereas when selection switch 14 is in the ON state, the outputs of switches 7a to 7e are provided by the selection circuit 13 to the plurality of lines connected to the tape-control section 12. Of course, the electrical function of selection switch 14 could be reversed.

Channel selecting switches 7a to 7e via selection circuit 13 together with the band selecting switch 8 provide control voltages from power supply 50 to a read-write memory 9 when selection switch 14 is in the OFF state. These control voltages are the address signals for memory 9. As discussed below, read-write memory 9 on command operates to store the output of the up-down counter 2 on bus 44 in an address specified by the outputs of the channel selecting switches 7a through 7e and the band selecting switch 8, or to read and supply the tuning information stored in the specified address to the up-down counter 2 via bus 52.

A control circuit 10 is also provided and is adapted to receive the address control voltages from the channel selecting switches 7a to 7e via selection circuit 13 and the band selecting switch 8. A presetting switch 11 of the non-lock or push button type also provides a control voltage from power supply 50 to the control circuit 10. When the presetting switch 11 is OFF, control circuit 10 provides a load signal L on a line 54 to the up-down counter 2 when the channel selecting switches 7a through 7e via selection circuit 13 provide their outputs. On the other hand, when the presetting switch 11 is ON, control circuit 10 provides a write pulse W on a line 56 to the read-write memory 9 when the channel selecting switches 7a through 7e via selection circuit 13 provide their outputs. It should be noted that when one of the selecting switches 7a through 7e have been selected by the user when the selection switch 14 is in the ON state, control circuit 10 does not provide either a load signal L to line 54 or a write pulse W to line 56.

As stated above, a plurality of output lines corresponding to the mode control switches 7a to 7e are connected to the tape-control section 12. The output of the tape-control section 12 is provided via a line 16 to the input of a sensing circuit 15. A first-output of sensing circuit 15 is connected via line 40 to the clock pulse input of binary up/down counter 2, and the second output of sensing circuit 15 is connected via line 42 to the up-pulse/down-pulse input of binary up/down counter 2.

When selection switch 14 is in the ON state, the outputs of switches 7a to 7e are provided by the selection circuit 13 to the tape-control section 12. Tape-control section 12, in turn, provides an output on line 16 to sensing circuit 15. Depending on the output signal on line 16, sensing circuit 15 provides on lines 40, 42 an up-pulse U or a down-pulse D corresponding to the running direction of the recording tape (not shown) and a clock pulse KC having a period corresponding to the running speed of the tape. It should be understood that the tape-control section 12 controls the operation of the magnetic recording and reproducing unit (not shown). Thus, the outputs of switches 7a to 7e via selection circuit 13 and the tape-control section 12 control the operation of the magnetic recording and reproducing unit.

The user manually operates or tunes the receiver by operating, i.e., tuning, pulse generator 1, which provides clock pulses KC and up/down U/D pulses to counter 2, as described above. Counter 2, in turn, provides an output count signal in parallel format via bus 44 to pulse synthesizer 4. Pulse synthesizer 4, in turn, provides a serial pulse train via line 46 to the input of low-pass filter 5, whose output is a DC voltage signal whose amplitude corresponds to the count output from counter 2. The DC voltage signal is applied via band selecting switch 6 to the tuning circuit and electronically controls the tuning of the receiver. The user can manually tune the receiver in the above-described manner only when none of the selecting switches 7a through 7e have been selected.

The method to preset the receiver to a desired station is now described. After the user has manually selected the desired station in accordance with the above-described method, the presetting switch 11 is first turned, then the channel selecting switches 7a through 7e corresponding to the address of the channel to the preset is turned, and finally the selection switch 14 is turned to the OFF state. As a result, the write pulse W is applied to the read-write memory 9 by the control circuit 10, which causes the count output of the up-down counter 2 (i.e., the digital signal representative of the tuning frequency being received) to be stored in memory 9 in the address specified by the band selecting switch 8 and by the channel selecting switches 7a through 7e which have been turned as described above. Desired frequencies can be preset for other channels in a similar fashion.

The method for automatically tuning the receiver to a frequency stored in memory 9 is now described. The address where a digital signal corresponding to a desired station is selected by the band selecting switch 8 and one of the channel selecting switches 7a through 7e via selection circuit 13 (which means selection switch 14 is in the OFF state). In this operation, because the presetting switch 11 is open or in the OFF state, the control circuit 10 applies the load signal L to the up-down counter 2. As a result, the read-write memory 9 reads out the information stored at the address indicated by the band selecting switch 8 and the channel selecting switches 7a through 7e. The signal read out from read-write memory 9 is applied in a parallel format via bus 52 to up-down counter 2, the output of which is applied to the digital synthesizer 4. This results in a station being selected in a manner similarly to the case of manual operation. Thereafter, preset station selection in the same band can be accomplished by selectively turning only the channel selecting switches 7a through 7e. In addition, preset station selections in different bands can be accomplished by selectively operating the channel selecting switches 7a through 7e after the band selecting switch 8 has been changed.

The method of operating the recording and reproducing unit is now described. The selection switch 14 is placed in the ON state, so that the output control voltages from the mode control switches 7a to 7e provided by the selection circuit 13 to the tape-control section 12. As stated above, mode control switches 7a through 7e correspond to "fast forward (FF)", "rewind (R)", "eject (E)", "play (P1)" and "play (P2)", respectively. Of course, mode control switches 7a to 7e could control other functions of the recording and reproducing unit.

For purposes of explanation only, the case when mode control switch 7a is operated is now described. Because selection switch 14 is in the ON state, the control voltage output from mode control switch 7a, which is the "fast forward (FF)" command voltage, is applied through the selection circuit 13 to the tape-control section 12. As a result, the tape-control section 12 causes the tape drive mechanism (not shown) of the recording and reproducing unit to move the tape forward in the fast mode. In addition, tape-control section 12 provides a signal indicating the fast forward mode to the sensing circuit 15 via line 16.

Sensing circuit 15, in turn, generates an up-pulse U or down-pulse D signal for line 42 corresponding to the direction of travel of the tape (not shown), and also generates a clock pulse KC for line 40 corresponding to the tape speed. These signals are provided by lines 40, 42 to the up-down counter 2.

The up-down counter 2 counts the clock pulses KC successively in response to the up/down signals U/D. The output from up-down counter 2 is applied via bus 44 to the digital display unit 3. Digital display unit 3 visually displays, for example, by a light emitting diode (LED), the direction and speed of the tape as indicated by the output from up-down counter 2. For example, in the case of fast forward operation, a visual display unit 3a on the right-hand side of the digital display unit 3 (with respect to viewing the digital display unit 3 from the front panel) would be lighted. In similiar fashion, a lighted visual display unit 3b on the left-hand side would indicate reverse tape movement, and the distance from the center point would indicate tape speed. Of course, any suitable arrangement for visually displaying the selected control mode can be used for digital display unit 3. Accordingly, the operating condition of the magnetic recording and reproducing unit is known by the visual display of the digital display unit 3.

The description above was made with reference to the fast forward mode of operation. It should be noted, however, that the other modes of operation of the magnetic recording and reproducing unit tape take place in a similar fashion.

As is apparent from the above description, the present invention comprises a combination device having an electronic tuning type receiver and a magnetic recording and reproducing unit, where the channel presetting switches of the electronic tuning the receiver can also act as the operating switches of the magnetic recording and reproducing unit.

What is claimed is:

1. In a combination of an electronic tuning type receiver and a magnetic recording and reproducing unit, wherein said electronic tuning type receiver is of the type which is tuned by control signals provided to a tuning means by a plurality of channel selecting switches, the improvement comprising:

a. selection circuit means interposed between said tuning means and said plurality of channel selecting switches for providing said plurality of control signals to said tuning means when a selection switch is in the first binary state, and for providing said control signals from said plurality of channel selecting switches as a second set of outputs when said selection switch is in a second binary state; and b. tape-control sensing means responsive to said second set of outputs for controlling the operation of said magnetic recording and reproducing unit in accordance with said second set of outputs.

2. The combination unit as recited in claim 1, wherein said modes of operation of said magnetic recording and reproducing unit controlled by said tape-control sensing means in accordance with said second set of outputs include the fast forward mode, the rewind mode, the eject mode, the first-speed play mode, and the second-speed play mode.

3. The combination unit as recited in claim 1, further comprising digital display unit means responsive to said tuning means for visually displaying selected channel information in a predetermined fashion.

4. The combination unit as recited in claim 3, wherein said tape-control section means further provides an output signal having information indicative of said second set of outputs, wherein said digital display unit means is responsive to a plurality of mode signals for visually displaying said mode signals in a predetermined fashion, and further comprising sensing circuit means responsive to said output signal of said tape-control section means for providing said mode signals having information indicative of said output signal.

5. The combination unit as recited in claim 4, wherein said digital display unit includes a plurality of visual display elements disposed from left to right with respect to the front of said digital display unit.

6. The combination unit as recited in claim 5, wherein said visual display elements are lighted in a designated fashion in accordance with said mode signals such that a visual display element to the right of a center point is lighted when said magnetic recording and reproducing unit is in a forward mode of operation and such that a visual display element to the left of a center point is lighted when said magnetic recording and reproducing unit is in a reverse mode of operation.

7. The combination unit as recited in claim 6, wherein the absolute distance of said lighted visual display unit from center point is in accordance with the absolute value of the speed of said forward or reverse mode of operation, respectively.

* * * * *